United States Patent
Lee et al.

(10) Patent No.: US 7,910,965 B2
(45) Date of Patent: Mar. 22, 2011

(54) IMAGE SENSOR CIRCUITS INCLUDING SHARED FLOATING DIFFUSION REGIONS

(75) Inventors: Seok-Ha Lee, Seoul (KR); Chang-Rok Moon, Seoul (KR); Kang-Bok Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 12/139,022

(22) Filed: Jun. 13, 2008

(65) Prior Publication Data

US 2008/0308852 A1    Dec. 18, 2008

(30) Foreign Application Priority Data

Jun. 13, 2007    (KR) .................. 10-2007-0057807

(51) Int. Cl.
*H01L 31/113*    (2006.01)
(52) U.S. Cl. ............... 257/292; 257/E31.097; 348/294
(58) Field of Classification Search .............. 257/292, 257/E31.097, E21.657; 348/281, 294, 301, 348/302, 308
See application file for complete search history.

(56) References Cited

U.S. PATENT DOCUMENTS

| | | | | |
|---|---|---|---|---|
| 6,947,088 B2* | 9/2005 | Kochi | | 348/308 |
| 7,436,010 B2* | 10/2008 | Mori et al. | | 257/292 |
| 7,518,172 B2* | 4/2009 | Moon et al. | | 257/292 |
| 7,525,077 B2* | 4/2009 | Kim et al. | | 250/208.1 |
| 7,541,628 B2* | 6/2009 | Lee et al. | | 257/239 |
| 7,687,837 B2* | 3/2010 | Park et al. | | 257/294 |
| 7,710,477 B2* | 5/2010 | Nam et al. | | 348/275 |
| 2007/0045514 A1* | 3/2007 | McKee et al. | | 250/208.1 |
| 2007/0052055 A1* | 3/2007 | McKee | | 257/462 |
| 2009/0225210 A1* | 9/2009 | Sugawa | | 348/308 |

FOREIGN PATENT DOCUMENTS

| | | |
|---|---|---|
| JP | 2005-020716 | 1/2005 |
| JP | 2005-167579 | 6/2005 |
| JP | 2005-167958 | 6/2005 |
| KR | 1020050000373 A | 1/2005 |
| KR | 1020070006982 A | 1/2007 |

* cited by examiner

*Primary Examiner* — Jerome Jackson, Jr.
*Assistant Examiner* — Paul A Budd
(74) *Attorney, Agent, or Firm* — Myers Bigel Sibley & Sajovec, P.A.

(57) ABSTRACT

An image sensor can include a plurality of photoelectric conversion elements arranged in a matrix. A plurality of floating diffusion regions can be shared by respective corresponding pairs of adjacent photoelectric conversion elements. A plurality of charge-transmission transistors can respectively correspond to the photoelectric conversion elements, where each of the charge-transmission transistors are connected between a corresponding one of the plurality of photoelectric conversion elements and a corresponding one of the plurality of floating diffusion regions. A plurality of charge-transmission lines can be commonly connected to gates of respective corresponding pairs of adjacent rows of charge-transmission transistors, where each of the respective corresponding pairs of adjacent rows of charge-transmission transistors can be connected to respective ones of the plurality of photoelectric conversion elements in different adjacent rows of floating diffusion regions.

7 Claims, 8 Drawing Sheets

FIG. 2

| | | | | | | | |
|---|---|---|---|---|---|---|---|
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |

PX

IMAGE SENSOR CIRCUITS INCLUDING SHARED FLOATING DIFFUSION REGIONS

CROSS-REFERENCE TO RELATED APPLICATION

This application claims priority from Korean Patent Application No. 10-2007-0057807 filed on Jun. 13, 2007 in the Korean Intellectual Property Office, the disclosure of which is incorporated herein by reference in its entirety.

FIELD OF THE INVENTION

The present invention relates to an image sensor and, more particularly, to an image sensor with an improved light-receiving efficiency.

BACKGROUND

Image sensors can convert an optical image into an electric signal. With recent developments in the computer industry and the communication industry, there is demand for image sensors with improved performance in various devices such as digital cameras, camcorders, personal communication systems, gaming devices, security cameras, medical microcameras, and robots.

Metal-oxide semiconductor (MOS) image sensors may be easy to drive, and can be driven using various scanning techniques. Also, since signal processors may be integrated into a single chip, it is possible to miniaturize MOS image sensors and reduce the manufacturing cost of MOS image sensors by using a typical MOS processing technique. The power consumption of MOS image sensors is generally low, and, thus, MOS image sensors can be applied to devices with limited battery capacity. For the above-mentioned reasons, the use of MOS image sensors capable of realizing high resolution has dramatically increased.

However, as the integration density of pixels is increased in order to keep up with increasing demand for high resolution, the area of photoelectric conversion elements per unit pixel may be decreased and, thus, sensitivity and saturated signal amount may also decrease. Therefore, active pixel sensor (APS) arrays in which a plurality of photoelectric conversion elements share a read element to maximize the area of light receivers, i.e., the area of photoelectric conversion elements, and thus to increase light-receiving efficiency have been widely adopted.

However, even if a plurality of photoelectric conversion elements share a read element, the read element should read charge accumulated in each of the photoelectric conversion elements. Thus, a plurality of charge-transmission transistors respectively corresponding to the photoelectric conversion elements may need to be turned on or off in response to an additional charge-transmission signal or may need to output charge through additional output lines. In this case, however, the required number of charge-transmission lines or output lines may not be able to be reduced, thereby making it difficult to secure a maximum light-receiving efficiency.

SUMMARY

Embodiments according to the invention can provide image sensor circuits including shared floating diffusion regions. Pursuant to these embodiments, an image sensor can include a plurality of photoelectric conversion elements arranged in a matrix. A plurality of floating diffusion regions can be shared by respective corresponding pairs of adjacent photoelectric conversion elements. A plurality of charge-transmission transistors can respectively correspond to the photoelectric conversion elements, where each of the charge-transmission transistors are connected between a corresponding one of the plurality of photoelectric conversion elements and a corresponding one of the plurality of floating diffusion regions. A plurality of charge-transmission lines can be commonly connected to gates of respective corresponding pairs of adjacent rows of charge-transmission transistors, where each of the respective corresponding pairs of adjacent rows of charge-transmission transistors can be connected to respective ones of the plurality of photoelectric conversion elements in different adjacent rows of floating diffusion regions.

BRIEF DESCRIPTION OF THE DRAWINGS

The above and other aspects and features of the present invention will become apparent by describing in detail exemplary embodiments thereof with reference to the attached drawings, in which:

FIG. 2 illustrates a layout of the pattern of the arrangement of colors of the active pixel sensor (APS) array illustrated in FIG. 1;

DESCRIPTION OF EMBODIMENTS ACCORDING TO THE INVENTION

Figure 1:
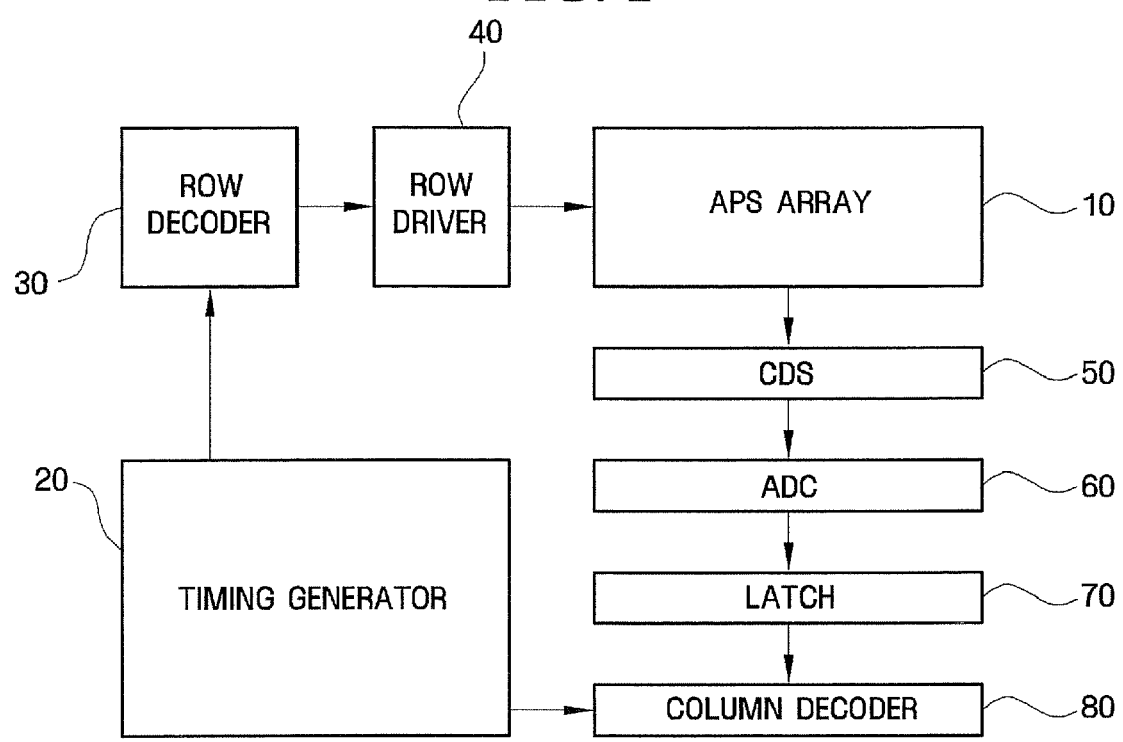
FIG. 1 illustrates a block diagram of an image sensor according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "directly adjacent to" another element or layer, there are no intervening elements or layers present. As used herein the term "and/or" includes any and all combinations of one or more of the associated listed items.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below. Like numbers refer to like elements throughout.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

The present invention will hereinafter be described in detail with reference to the accompanying drawings in which embodiments of the invention are shown. In the embodiments of the present invention, an image sensor is a complementary metal oxide semiconductor (CMOS) image sensor. However, the present invention may be applied not only to an image sensor obtained by CMOS processes, which involve both N-channel metal oxide semiconductor (NMOS) and P-channel metal oxide semiconductor (PMOS) processes, but also to an image sensor obtained by NMOS processes or an image sensor obtained by PMOS processes.

FIG. 1 illustrates a block diagram of an image sensor according to an embodiment of the present invention. Referring to FIG. 1, the image sensor includes an active pixel sensor (APS) array 10 in which a plurality of pixels, each including a photoelectric conversion element, are arranged two-dimensionally, a timing generator 20, a row decoder 30, a row driver 40, a correlated double sampler (CDS) 50, an analog-to-digital converter (ADC) 60, a latch 70, and a column decoder 80.

The APS array 10 includes a plurality of pixels which are arranged two-dimensionally. Each of the pixels includes a photoelectric conversion element and a read element in order to convert an optical image into an electric signal. The APS array 10 is driven by receiving a pixel selection signal SEL, a reset signal RX, and a charge-transmission signal TX from the row driver 40. The APS array 10 also provides an electric signal to the CDS 50 via a vertical signal line.

The timing generator 20 provides a timing signal and a control signal to the row decoder 30 and the column decoder 80.

The row driver 40 provides the APS array 10 with a plurality of driving signals for driving the pixels in the APS array 10 according to the result of decoding performed by the row decoder 30. If the pixels in the APS array 10 are arranged in a matrix, the row driver 40 may provide a driving signal to each row of pixels.

The CDS 50 receives an electric signal generated by the active pixel sensor array 10 via a vertical signal line, and holds and samples the received electric signal. The CDS 50 may sample a noise level and a signal level of the electric signal and output an analog signal corresponding to the difference between the noise level and the signal level.

The ADC 60 converts the analog signal output by the CDS 50 into a digital signal and outputs the digital signal.

The latch 70 latches the digital signal output by the ADC 60 so that the digital signal can be stepwise output to an image signal processor (not shown) according to the result of decoding performed by the column decoder 80.

FIG. 2 illustrates a layout of the pattern of the arrangement of colors in the APS array 10 illustrated in FIG. 1. APS array includes a plurality of pixels which are arranged in matrix two-dimensionally and each of the pixels in the APS array 10 corresponds to one of e.g. red (R), green (G), and blue (B) color filters. FIG. 2 illustrates a Bayer color filter array in which half the total number of color filters is green color filter. However, the pattern of the arrangement of color filters may vary.

Figure 3:
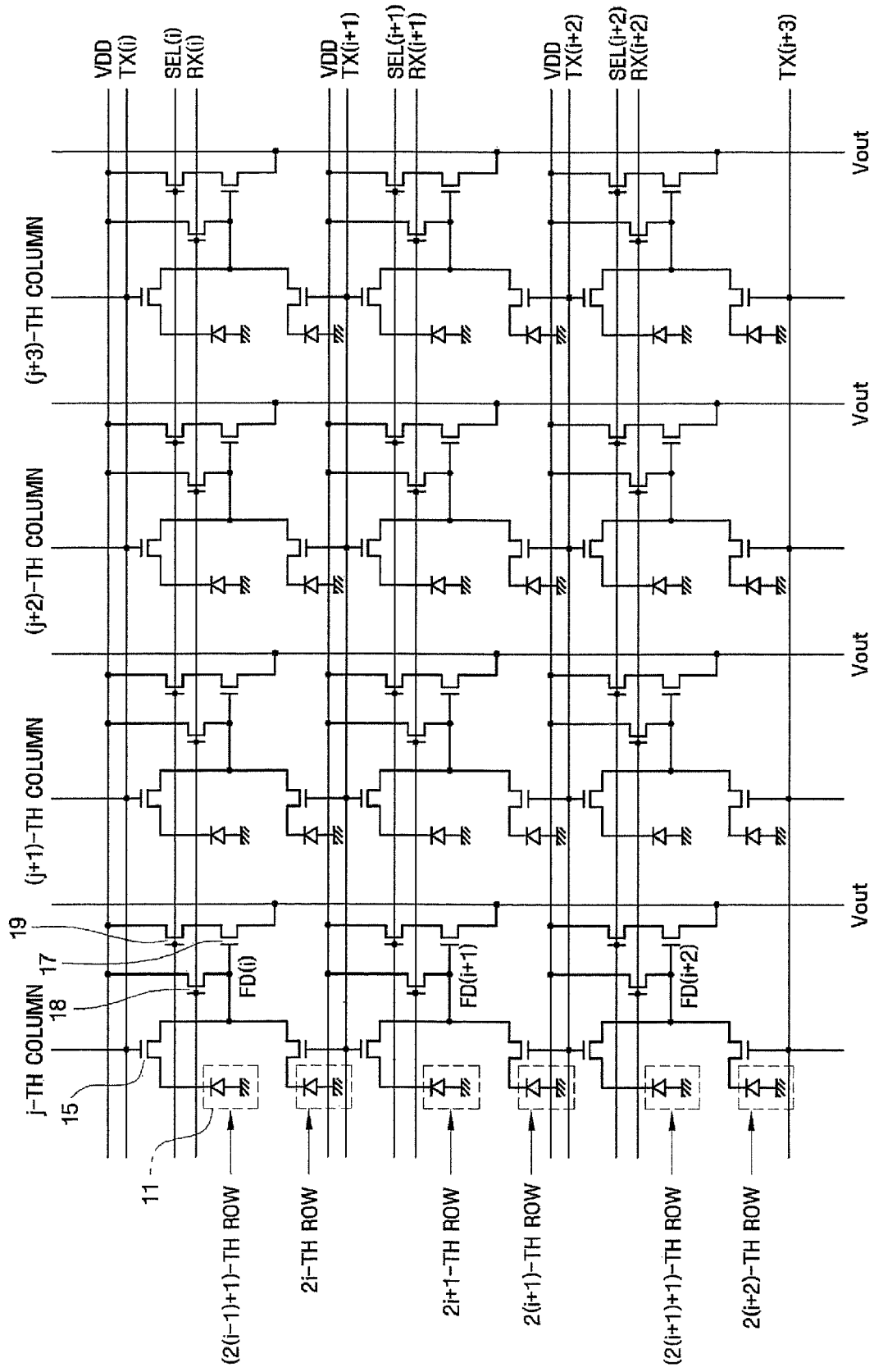
FIG. 3 illustrates an equivalent circuit diagram of the image sensor illustrated in FIG. 1.

FIG. 3 illustrates an equivalent circuit diagram of the image sensor illustrated in FIG. 1. Referring to FIG. 3, each of the pixels in the APS array 10 includes a photoelectric conversion element 11 which accumulates an amount of charge corresponding to the amount of light incident thereupon. Each of the photoelectric converters 11 may include a photodiode, a phototransistor, a photogate, a pinned photodiode or a combination thereof.

The photoelectric conversion elements 1 are connected to respective corresponding charge-transmission transistors 15. That is, there are as many charge-transmission transistors 15 as there are photoelectric conversion elements 11, and the photoelectric conversion elements 11 respectively correspond to the charge-transmission transistors 15. Therefore, the charge-transmission transistors 15 may be classified into the same rows of pixels as the respective photoelectric conversion elements 11.

Each of the charge-transmission transistors 15 transmits charge accumulated in a corresponding photoelectric conversion element 11 to a floating diffusion region FD adjacent to the corresponding photoelectric conversion element 11. Specifically, each of the drains of the charge-transmission transistors 15 is connected to a corresponding photoelectric conversion element 11, and each of the sources of the charge-transmission transistors 15 is connected to a corresponding floating diffusion region FD. Each of the gates of the charge-transmission transistors 15 is connected to a corresponding charge-transmission line TX. Thus, the charge-transmission transistors 15 are turned on or off in response to a charge-transmission signal transmitted thereto through the respective charge-transmission lines TX.

Each of the charge-transmission transistors 15 is connected to a corresponding pair of vertically adjacent photoelectric conversion elements 11 and each of the drains of the charge-transmission transistors 15 is also connected to a corresponding floating diffusion region FD. That is, a pair of vertically adjacent photoelectric conversion elements 11 share one floating diffusion region FD through a charge-transmission transistor 15 connected thereto. Therefore, a floating diffusion region FD may be provided for every two rows of photoelectric conversion elements 11 in the same column or for every two rows of charge-transmission transistors 15 in the same column. Accordingly, the number of floating diffusion regions FD may be half the number of photoelectric conversion elements 11 or the number of charge-transmission transistors 15. For example, if the photoelectric conversion elements 11 are arranged in a 2m×n matrix, the number of photoelectric conversion elements 11 and the number of charge-transmission transistors 15 may both be 2m×n, and the number of floating diffusion regions FD may be m×n.

The gates of a pair of vertically adjacent charge-transmission transistors 15 may be connected to a charge-transmission line TX. That is, a pair of vertically adjacent charge-transmission transistors 15 may share one charge-transmission line TX as a gate line. For example, a charge-transmission line TX may be provided for and shared between every two vertically adjacent charge-transmission transistors 15. The charge-transmission lines TX extend in a column direction, and a plurality of columns of charge-transmission transistors 15 are connected to the respective charge-transmission lines TX through their gates. Thus, a pair of vertically adjacent charge-transmission transistors 15 may share one charge-transmission line TX as a gate line. Therefore, a charge-transmission line TX may be provided for every two rows of charge-transmission transistors 15.

A pair of vertically adjacent charge-transmission transistors 15 sharing the same charge-transmission line TX are connected to different floating diffusion regions FD. That is, the gates of a pair of vertically adjacent charge-transmission transistors 15 respectively corresponding to a pair of vertically adjacent photoelectric conversion elements 11 that share the same floating diffusion region FD are connected to different charge-transmission lines TX. Instead, the gates of a pair of vertically adjacent charge-transmission transistors 15 respectively connected to a pair of photoelectric conversion elements 11 not sharing the same floating diffusion region FD are connected to the same charge-transmission line TX. Therefore, a pair of vertically adjacent photoelectric conversion elements 11 sharing the same floating diffusion region FD do not share the same charge-transmission line TX, and a pair of vertically adjacent photoelectric conversion elements 11 sharing the same charge-transmission line TX do not share the same floating diffusion region FD.

For example, referring to FIG. 3, a $(2(i-1)+1)$-th photoelectric conversion element and a $2i$-th photoelectric conversion element 11 in a j-th column may share an i-th floating diffusion region FD(i), and a $(2i+1)$-th photoelectric element 11 and $2(i+1)$-th photoelectric conversion element in the j-th column may share an $(i+1)$-th floating diffusion region FD(i+1). A $(2i+1)$-th charge-transmission transistor 15 in the j-th column may share an $(i+1)$-th charge-transmission line TX(i+1) not with a $2(i+1)$-th charge-transmission transistor 15 but with a $2i$-th charge-transmission transistor 15. This directly may apply to columns, other than the j-th column.

Therefore, even if a pair of vertically adjacent charge-transmission transistors 15 connected to the same charge-transmission line TX are turned on, a pair of vertically adjacent photoelectric conversion elements 11 respectively connected to the pair of vertically adjacent charge-transmission transistors 15 transmit charge to different floating diffusion regions FD. Therefore, the charge transmitted to the different floating diffusion regions FD is read by different read elements. Thus, the pair of vertically adjacent photoelectric conversion elements 11 may be read separately by the different read elements.

The number of charge-transmission lines TX may be half the number of rows of photoelectric conversion elements 11. However, charge-transmission lines TX1 and TX(m+1) to which uppermost and lowermost rows of charge-transmission transistors 15 are respectively connected are not shared by other rows of charge-transmission transistors 15. Therefore, the number of charge-transmission lines TX may be one more than half the number of rows of photoelectric conversion elements 11. For example, if the photoelectric conversion elements 11 are arranged in a 2m×n matrix, the number of charge transmission liens TX may be (m+1). In this case, it is assumed that each pair of rows of photoelectric conversion elements 11 share respective corresponding floating diffusion regions FD therebetween, and that the number of photoelectric conversion elements 11 is m×n. However, the present invention is not restricted to this. That is, all the charge-transmission lines TX may be shared by respective pairs of rows of charge-transmission transistors 15. In this case, the number of charge-transmission lines TX is m, and the number of floating diffusion regions FD may be (m+1)×n.

The charge transmitted to a floating diffusion region FD is read by a read element. The read element is a device for reading an optical signal input to a photoelectric conversion element 11, and may include, for example, a drive element, a reset element and/or a selection element.

Specifically, a drive element of a read element amplifies the electric potential of a floating diffusion region FD to which the charge accumulated in a photoelectric conversion element 11 is transmitted, and outputs the result of the amplification to a vertical signal line Vout. The drive element may include, for example, a source follower amplification transistor 17. Referring to FIG. 3, the gate of a source follower amplification transistor 17 may be connected to the floating diffusion region FD, the drain of the source follower amplification transistor 17 may be connected to a vertical signal line Vout, and the source of the source follower amplification transistor 17 may be connected to the drain of a selection transistor 19.

A reset element of a read element periodically resets a floating diffusion region FD. The reset element may include a MOS transistor, i.e., a reset transistor 18 which is driven in response to a reset signal provided by a reset line RX that provides a predetermined bias. Referring to FIG. 3, the gate of a reset transistor 18 is connected to a reset line RX, the drain of the reset transistor 18 is connected to a power supply voltage line VDD, and the source of the reset transistor 18 is connected to a floating diffusion region FD.

A selection element of a read element selects a column of pixels from which data is to be read. Specifically, the selection element outputs an electric potential amplified by an amplification transistor 17 to a vertical signal line Vout. The selection element may include a MOS transistor, i.e., a selection transistor 19 which is driven in response to a column selection signal provided by a row selection line SEL. Referring to FIG. 3, the gate of a selection transistor 19 is connected to a row selection line SEL, the drain of the selection transistor 19 is connected to a power supply voltage line VDD, and the source of the selection transistor 19 is connected to the drain of an amplification transistor 18.

As described above, a floating diffusion region FD is shared by a pair of vertically adjacent photoelectric conversion elements 11, and corresponds to a read element. Thus, the pair of vertically adjacent photoelectric conversion elements 11 share a read element. Therefore, the number of amplification transistors 17, the number of reset transistors 18, and the number of selection transistors 19 are substantially half the number of photoelectric conversion elements 11.

A plurality of reset lines RX, a plurality of row selection lines SEL, and/or a plurality of power supply voltage lines VDD may extend in the row direction, and may be connected to respective corresponding pairs of adjacent rows of charge-transmission transistors 15 using the same method. Therefore, the number of reset lines RX, the number of row selection lines SEL, and/or the number of power supply voltage lines VDD may be the same as the number of rows of floating diffusion regions FD and may be half the number of rows of photoelectric conversion elements 11.

A plurality of vertical signal lines Vout may extend in the column direction, and may be connected to respective corresponding columns of amplification transistors 17. The vertical signal lines Vout may be provided for respective corresponding columns of photoelectric conversion elements 11. Thus, the number of vertical signal lines Vout may be the same as the number of columns of photoelectric conversion elements 11.

Figure 4:
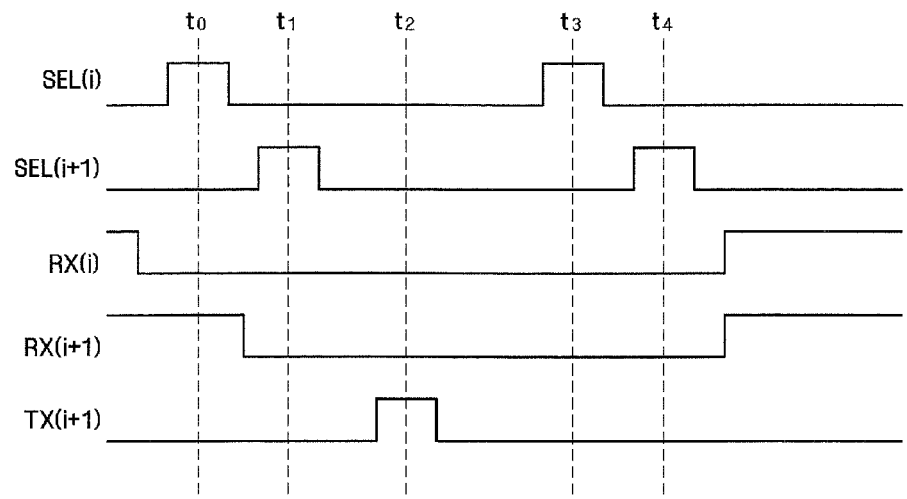
FIG. 4 illustrates a timing diagram of the image sensor illustrated in FIG. 1.

An operation of the image sensor illustrated in FIG. 1 will hereinafter be described in detail with reference to FIGS. 3 and 4. FIG. 4 illustrates a timing diagram of the image sensor illustrated in FIG. 1. The operation of the image sensor illustrated in FIG. 1 will hereinafter be described, focusing mainly on the reading of electric signals obtained by a j-th column of photoelectric conversion elements 11. However, the present invention directly applies to the reading of electric signals obtained by other columns of photoelectric conversion elements 11.

Referring to FIGS. 3 and 4, the photoelectric conversion elements 11 of a plurality of pixels arranged in a matrix commonly accumulate charge therein. A reset signal is applied to the reset lines RX, a row-selection signal is applied to the row selection lines SEL, and a charge-transmission signal is applied to the charge-transmission lines TX.

Specifically, referring to FIG. 4, if a reset signal applied to an i-th reset line SEL(i) by an i-th reset line RX(i) and a reset signal applied to an (i+1)-th reset line SEL(i+1) by an (i+1)-th reset line RX(i+1) both become high before a time t0, i-th and (i+1)-th floating diffusion regions FD(i) and FD(i+1) are both reset to a power supply voltage. Since the i-th and (i+1)-th floating diffusion regions FD(i) and FD(i+1) are respectively connected to the gates of i-th and (i+1)-th amplification transistors 17, the power supply voltage is applied to the gates of the i-th and (i+1)-th amplification transistors 17.

The reset signal of the i-th reset line RX(i) becomes low at the time t0. Then, an i-th reset transistor 18 is turned off. Thereafter, when a row-selection signal having a high level is applied to an i-th row selection line SEL(i), an i-th selection transistor 19 is turned on, and thus, a reset level of the i-th floating diffusion region FD(i) is output to a vertical signal line Vout through the i-th selection transistor 19 and the i-th amplification transistor 17. Thereafter, the row-selection signal of the i-th row selection line SEL(i) becomes low, and, thus, the i-th selection transistor 19 is turned off.

The reset signal of the (i+1)-th reset line RX(i+1) becomes low at a time t1. Then, an (i+1)-th reset transistor 19 is turned off. Thereafter, when an row-selection signal having a high level is applied to the (i+1)-th row selection line SEL(i+1), an (i+1)-th selection transistor 19 is turned on, and, thus, a reset level of the (i+1)-th floating diffusion region FD(i+1) is output to the vertical signal line Vout through the (i+1)-th selection transistor 19 and the (i+1)-th amplification transistor 17.

A charge-transmission signal applied to an (i+1)-th charge-transmission line becomes high at a time t2. Then, a 2i-th charge-transmission transistor 15 and a (2i+1)-th charge-transmission transistor 15 are turned on. As a result, the charge accumulated in a 2i-th photoelectric conversion element 11 is transmitted to the i-th floating diffusion region FD(i) through the 2i-th charge-transmission transistor 15, and the charge accumulated in a (2i+1)-th photoelectric conversion element 11 is transmitted to the (i+1)-th floating diffusion region FD(i+1) through the (2i+1)-th charge-transmission transistor 15. Since the i-th floating diffusion region FD(i) and the (i+1)-th floating diffusion region FD(i+1) have parasitic capacitance, the i-th floating diffusion region FD(i) and the (i+1)-th floating diffusion region FD(i+1) store charge therein accumulatively, and thus the electric potential of the i-th floating diffusion region FD(i) and the (i+1)-th floating diffusion region FD(i+1) varies. A signal level of the 2i-th photoelectric conversion element 11 and a signal level of the (2i+1)-th photoelectric conversion element 11 are respectively stored in the i-th floating diffusion region FD(i) and the (i+1)-th floating diffusion region FD(i+1). Thereafter, when a charge-transmission signal applied to an (i+1)-th charge-transmission line TX(i+1) becomes low, the 2i-th charge-transmission transistor 15 and the (2i+1)-th charge-transmission transistor 15 are both turned off.

A row-selection signal having a high level is applied to the i-th row selection line SEL(i) at a time t3. Then, the i-th selection transistor 19 is turned on. As a result, the signal level stored in the i-th floating diffusion region FD(i) is output to the vertical signal line Vout through the i-th cell selection transistor 19 and the i-th amplification transistor 17. That is, a signal level of the 2i-th photoelectric conversion element 11 is output to the vertical signal line Vout through the i-th cell selection transistor 19 and the i-th amplification transistor 17.

Then, the CDS 50 performs double sampling on the signal level of the 2i-th photoelectric conversion element 11 and the reset level of the i-th floating diffusion region FD(i), and outputs the difference between the signal level of the 2i-th photoelectric conversion element 11 and the reset level of the i-th floating diffusion region FD(i) as final signal data. In this case, a row-selection signal applied to the (i+1)-th row selection line SEL(i) maintains a low level, and, thus, the (i+1)-th selection transistor 19 is not turned on. Therefore, the signal level stored in the (i+1)-th floating diffusion region FD(i+1) is not output to the vertical signal line Vout.

Thereafter, the row-selection signal applied to the i-th row selection line SEL(i) becomes low, and, thus, the i-th selection transistor 19 is turned off.

A row-selection signal having a high level is applied to the (i+1)-th row selection line SEL(i+1) at a time t4. Then, the (i+1)-th selection transistor 19 is turned on. Therefore, the signal level stored in the (i+1)-th floating diffusion region FD(i+1) is output to the vertical signal line Vout through the (i+1)-th cell selection transistor 19 and the (i+1)-th amplification transistor 17. That is, the signal level of the (2i+1)-th photoelectric conversion element 11 is output to the vertical signal line Vout through the (i+1)-th cell selection transistor 19 and the (i+1)-th amplification transistor 17. Then, the CDS 50 performs double sampling on the signal level of the (2i+1)-th photoelectric conversion element 11 and the reset level of the (i+1)-th floating diffusion region FD(i+1), and outputs the difference between the signal level of the (2i+1)-th photoelectric conversion element 11 and the reset level of the (i+1)-th floating diffusion region FD(i) as final signal data. Thereafter, the row-selection signal applied to the (i+1)-th row selection line SEL(i+1) becomes low, and, thus, the (i+1)-th selection transistor 19 is turned off.

The processes mentioned above with reference to FIGS. 3 and 4 are sequentially performed on other columns of pixels, other than a j-th column of pixels so that final signal levels of each column of photoelectric conversion elements 11 can be output.

In the embodiment of FIGS. 3 and 4, the reset levels and the signal levels of a pair of adjacent rows of photoelectric conversion elements 11 that share the same charge-transmission lines are output to the same vertical signal lines. Specifically, in the embodiment of FIGS. 3 and 4, the reset level of a first photoelectric conversion element 11 is output, and then the reset level of a second photoelectric conversion element 11 is output before the output of the signal level of the first photoelectric conversion element 11. Thus, in order to separately calculate the difference between the signal level and the reset level of the first photoelectric conversion element 1, and the difference between the signal level and the reset level of the second photoelectric conversion element 11 an additional element for storing a signal level and a reset level may be provided for each of the first and second photoelectric conversion elements 11 (hereinafter described in detail with reference to FIGS. 5 and 6).

Figure 5:
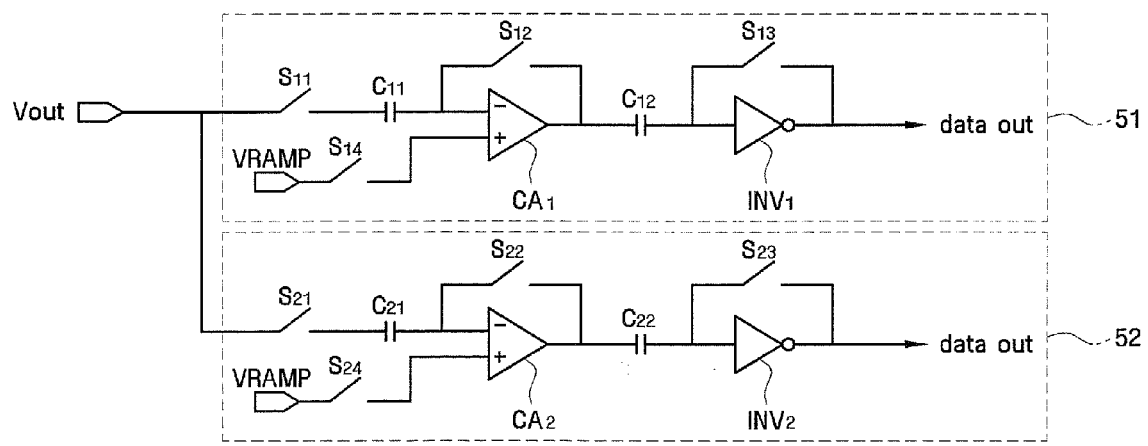
FIG. 5 illustrates a circuit diagram of an example of the correlated double sampler illustrated in FIG. 1.

FIG. 5 illustrates a circuit diagram of an example of the CDS 50 illustrated in FIG. 1. Referring to FIG. 5, the CDS 50 may include a first CDS 51 and a second CDS 52. The first CDS 51 includes four switches S11 through S14, two capacitors C11 and C12, a comparator CA1 and an inverter INV1. The comparator CA1 may be a differential amplifier. The second CDS 52 includes four switches S21 through S24, two capacitors C21 and C22, a comparator CA2 and an inverter INV2. For example, in the case of sampling the levels of signals respectively transmitted by a 2i-th charge-transmission transistor 15 and a (2i+1)-th charge-transmission transistor 15 which share the (i+1)-th charge-transmission line TX(i+1), the first CDS 51 may be used to sample the level of the signal transmitted by the 2i-th charge-transmission transistor 15, and the second CDS 52 may be used to sample the level of the signal transmitted by the (2i+1)-th charge-transmission transistor 15. The second CDS 52 has substantially the same structure as the first CDS 51, and substantially the same operation as the first CDS 51, thus, an operation of the CDS 50 will hereinafter be described in further detail, focusing mainly on the first CDS 51.

The first switch S11 is connected between a vertical signal line Vout and a first end of a signal storage capacitor C11. A second end of the signal storage capacitor C11 is connected to a negative input terminal of the comparator CA1, The fourth switch S14 is connected between a ramp signal VRAMP and a positive input terminal of the comparator CA1. The second switch S12 is connected between the negative input terminal of the comparator CA1 and an output terminal of the comparator CA1. A first end of the signal-transmission capacitor C12 is connected to the output terminal of the comparator CA1. An input terminal of the inverter INV1 is connected to a second end of the signal-transmission capacitor C12.

An operation of the first CDS 51 will hereinafter be described in detail. When a reset level is output from the vertical signal line Vout, the four switches S11 through S14 of the first CDS 51 are all turned on. An initial voltage Vcom of the ramp signal VRAMP is input to the positive input terminal of the comparator CA1, and the voltage of the negative input terminal of the comparator CA1 becomes as high as the initial voltage Vcom due to the output of the comparator CA1. As a result, an amount of charge corresponding to the difference between the reset level and the level of the initial voltage Vcom is stored in the signal storage capacitor C11. Thereafter, the four switches S11 through S14 are all turned off.

Thereafter, when a signal level is output from the vertical signal line Vout, the first and fourth switches S11 and S14 are turned on and an amount of charge corresponding to signal level is stored in the signal storage capacitor C11. Thereafter, the first switch S11 is turned off. If the voltage of the ramp signal VRAMP is varied while maintaining the fourth switch S14 to be turned on, the voltage of the signal storage capacitor C11 may vary according to the voltage of the ramp signal VRAMP. The time taken for the voltage of the signal storage capacitor C11 to reach a predefined reference level is measured, and a code value is assigned to the result of the measurement. Then, the result of the measurement is output as final signal level data of the 2i-th photoelectric conversion element 11.

The second CDS 52 outputs final signal level data of the (2i+1)-th photoelectric conversion element 11 using almost the same method as that used by the first CDS 51. However, the operation of the second CDS 52 is different from the operation of the first CDS 51 in terms of when to turn on the switches S21 through S24 of the second CDS 52 and the duration in which the switches S21 through S24 of the second CDS 52 are turned on. For example, the first switch S11 of the first CDS 51 and the first switch S52 of the second CDS 52 can be prevented from being turned on at the same time. In this manner, it is possible to prevent a signal output by the first CDS 51 and a signal output by the second CDS 52 from being mixed with each other or from acting as noise.

Figure 6:
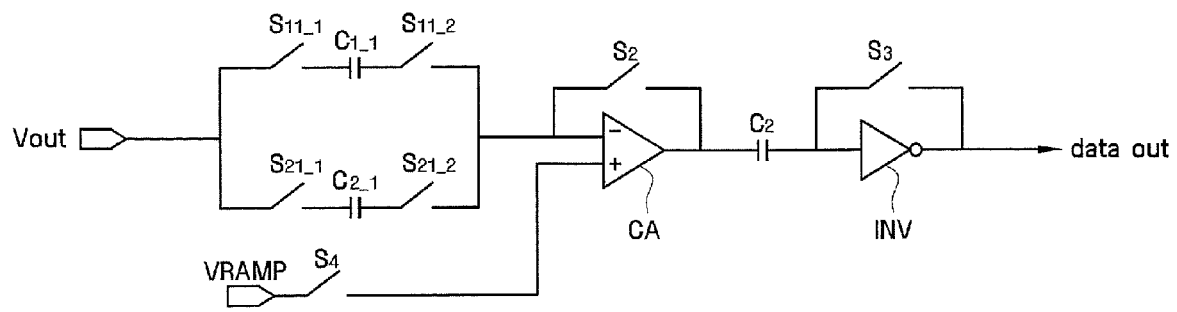
FIG. 6 illustrates a circuit diagram of another example of the correlated double sampler illustrated in FIG. 1.

FIG. 6 illustrates a circuit diagram of another example of the CDS 50 illustrated in FIG. 1. Referring to FIG. 6, the CDS 50 includes six switches S11_1, S11_2, S21_1, S21_2, S2 and S4, three capacitors C1_1, C2_1, and C2, a comparator CA, and an inverter INV. The first signal storage capacitor C1_1 and the second signal storage capacitor C2_1 are connected in parallel to each other.

The first signal storage capacitor C1_1 performs substantially the same functions as the first signal storage capacitor C11 of the first CDS 51 illustrated in FIG. 11. Likewise, the second signal storage capacitor C2_1 performs substantially the same functions as the second signal storage capacitor C21 of the second CDS 52 illustrated in FIG. 11. The switches S11_1 and S11_2 are respectively disposed on both sides of the first signal storage capacitor C1_1. The switches S21_1 and S21_2 are respectively disposed on both sides of the second signal storage capacitor C2_1. The switches S11_1, S11_2, S21_1 and S21_2 may be prevented from being turned on or off at the same time, thereby enabling the storage of charge in the first signal storage capacitor C1_1 to be performed independently from the storage of charge in the second signal storage capacitor C2_1.

As described above with reference to FIGS. 5 and 6, the CDS 50 may include the first CDS 51 and the second CDS 52 which are switched on or off independently from each other or may include the first signal storage capacitor C1_1 and the second signal storage capacitor C2_1 which are switched on or off independently from each other. Therefore, even if a reset level and a signal level of a pair of horizontally adjacent photoelectric conversion elements are output through the same vertical signal line Vout, it is possible to sample image signals of the pair of horizontally adjacent photoelectric conversion elements.

Figure 7:
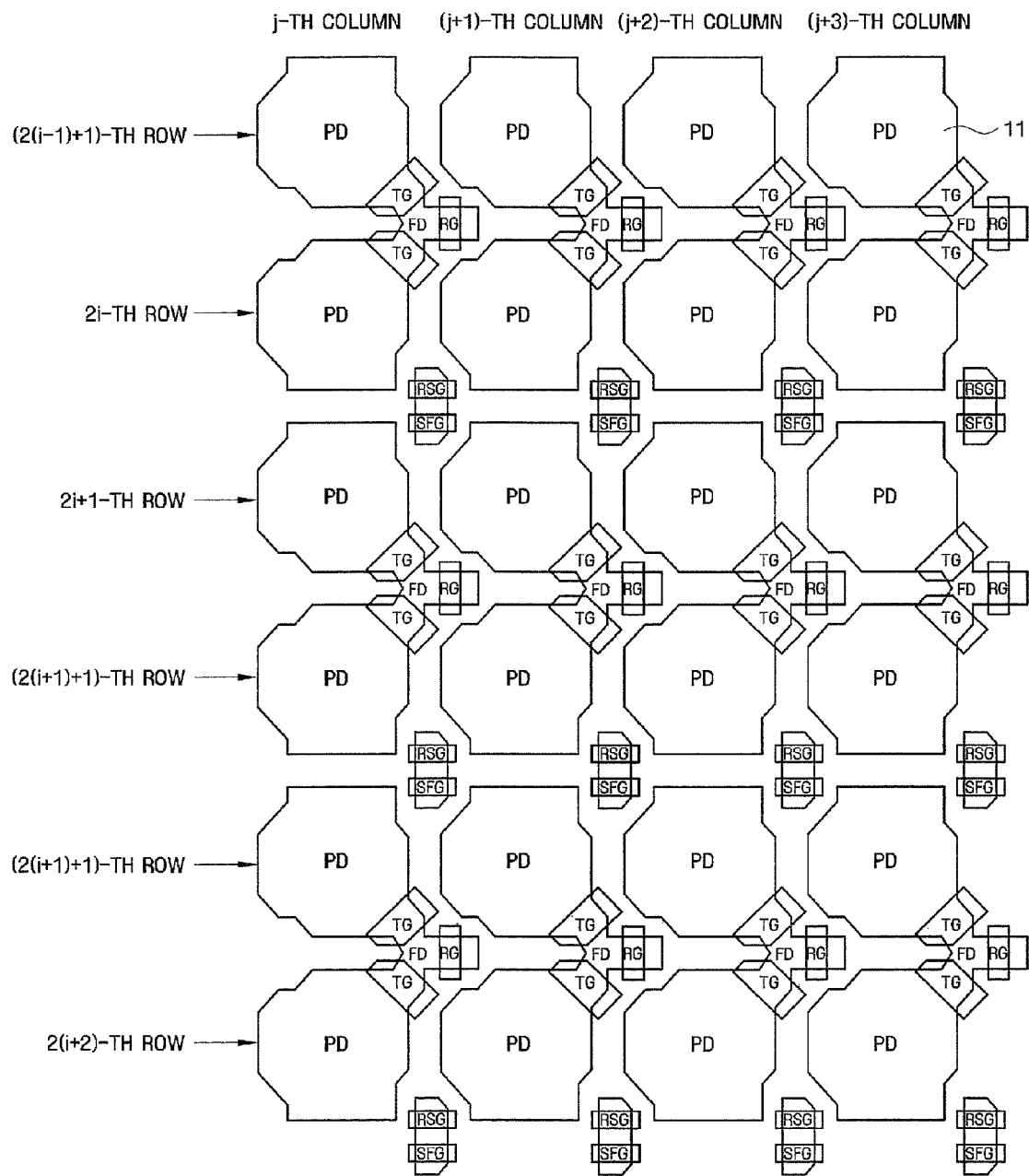
FIG. 7 illustrates a partial layout of the APS array illustrated in FIG. 1.

FIG. 7 illustrates a partial layout of the APS array 10 illustrated in FIG. 1. Referring to FIG. 7, some actives (hereinafter referred to as the first actives) are formed as one-axis merged dual-lobed actives. Each of the first actives includes a pair of vertically adjacent photoelectric conversion elements PD (11), a floating diffusion region FD shared by the pair of vertically adjacent photoelectric conversion elements PD, and two charge transmission gates TG formed between the pair of vertically adjacent photoelectric conversion elements PD and the floating diffusion region FD. Other actives, which are separated from the first actives, include a source follower amplification gate (SFG) and a selection gate (RSG).

Referring to FIG. 7, since two photoelectric conversion elements 11 share one floating diffusion region FD, it is possible to reduce the required number of floating diffusion regions FD by half and thus to increase the relative area of photoelectric conversion elements 11. Therefore, it is possible to improve light-receiving efficiency, light sensitivity, and saturated signal amount.

Figure 8:
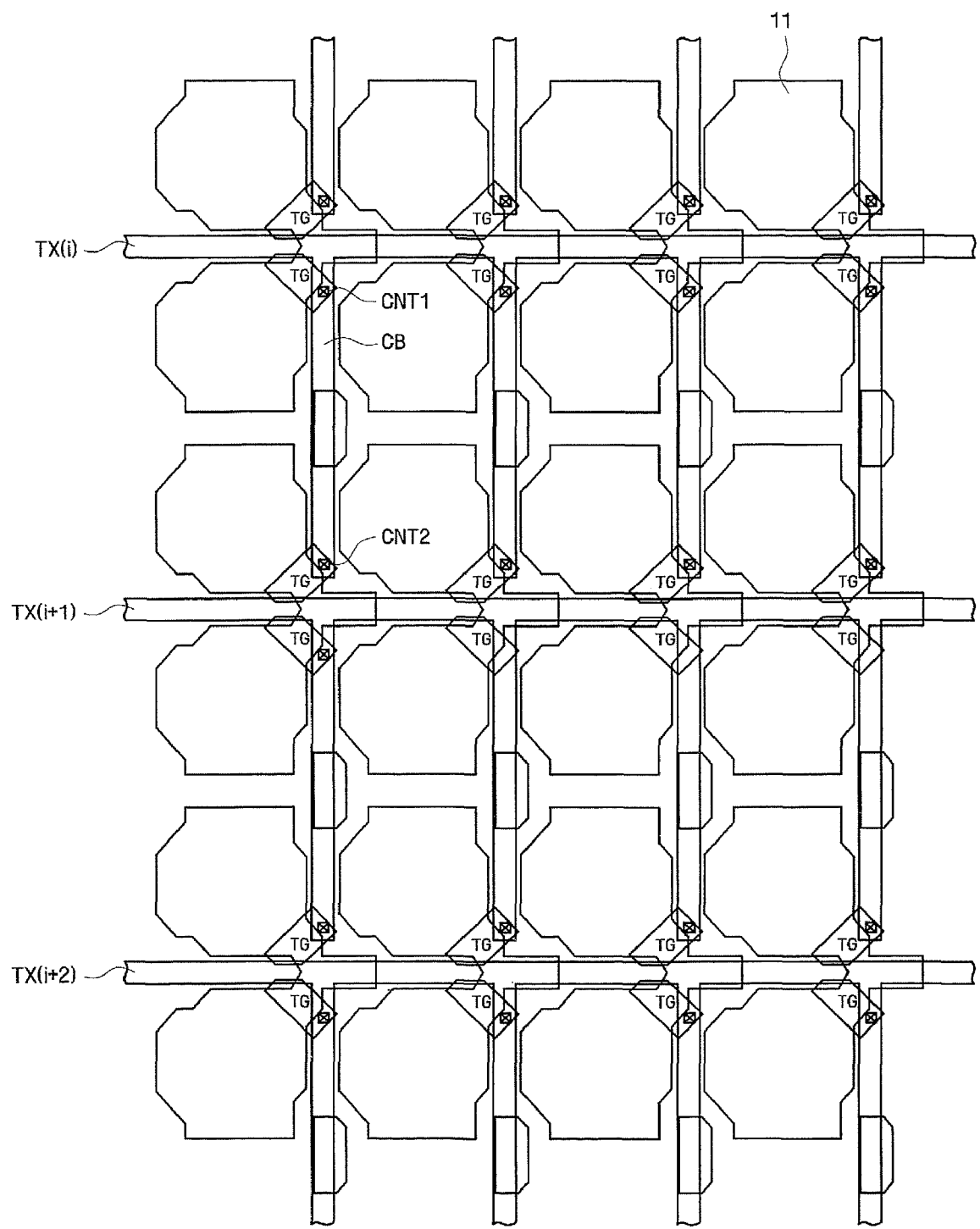
FIG. 8 illustrates a layout resulting from adding a plurality of charge-transmission lines to the layout illustrated in FIG. 7.

FIG. 8 illustrates a layout resulting from adding a plurality of charge-transmission lines TX to the layout illustrated in FIG. 7. Referring to FIG. 8, a charge-transmission line TX is provided for every two columns of photoelectric conversion elements PD. Specifically, a charge-transmission line TX extends across a corresponding row of floating diffusion regions FD in a column direction. A charge-transmission line TX is electrically connected, through a row of first contacts CNT1, to one of a pair of adjacent rows of charge transmission gates TG adjacent to a row of floating diffusion regions FD across which the charge-transmission line TX extends and is also electrically connected, through a row of second contacts CNT2, to one of another pair of adjacent rows of charge transmission gates adjacent to a row of floating diffusion regions FD located directly below the row of charge transmission gates across which the charge-transmission line TX extends. A charge-transmission line TX may include a plurality of extension branches CB which electrically connect the first contacts CNT1 to the respective second contacts CNT2.

In some embodiments according to the present invention, a charge-transmission line TX can be provided for two adjacent rows of photoelectric conversion elements 11. Therefore, the light-shielding area in a column direction decreases, and thus, the width of photoelectric conversion elements 11 in the column direction may be increased. Therefore, it may be possible to improve light-receiving efficiency, light sensitivity and saturated signal amount.

The image sensor according to the present invention adopts a 2-shared pixel architecture in which two photoelectric conversion elements share one floating diffusion region. In the image sensor according to the present invention, not only a charge-transmission line TX but also a vertical signal line (not shown) can be provided for every column of photoelectric conversion elements. In this case, the light-shielding area in the column direction further decreases and the width of photoelectric conversion elements in the column direction further increases, compared to the situation when a vertical signal line is provided for every two columns of photoelectric conversion elements. Therefore, it is possible to further improve the light-receiving efficiency, light sensitivity and amount of saturated signal amount.

Figure 9:
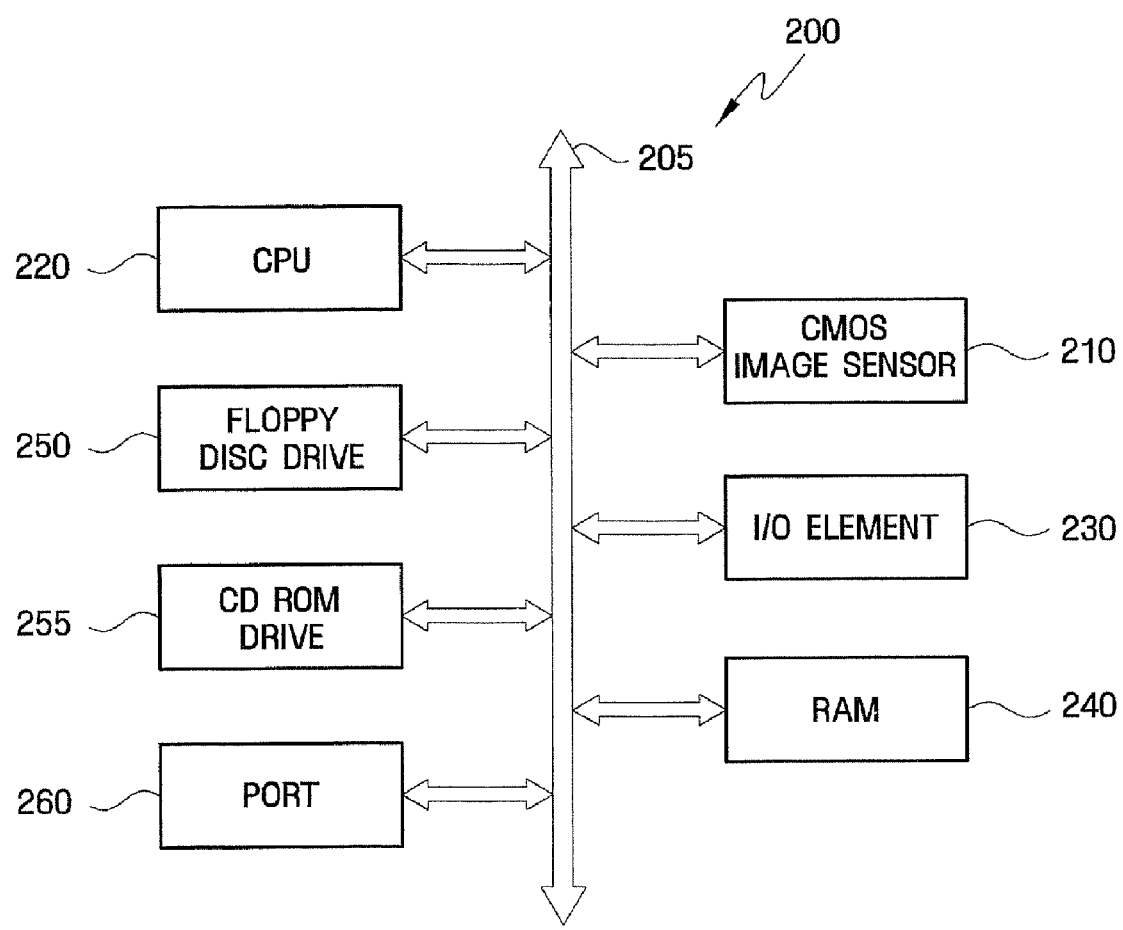
FIG. 9 illustrates a block diagram of a processor-based system including a complementary metal oxide semiconductor (CMOS) image sensor according to an embodiment of the present invention.

A processor-based system including the above-mentioned image sensor will hereinafter be described in detail. FIG. 9 illustrates a block diagram of a processor-based system 201 including a CMOS image sensor 210 according to an embodiment of the present invention. Referring to FIG. 9, the processor-based system 201 is a system for processing an output image of the CMOS image sensor 210. The processor-based system 201 may be a computer system, a camera system, a scanner, a mechanized clock system, a navigation system, a video phone, a surveillance system an auto-focusing system, a tracking system, a performance-monitoring system, or an image-stabilization system, but the present invention is not restricted to this.

The processor-based system 201 such as a computer system may include a central processing unit (CPU) 220 such as a microprocessor which can communicate with an input/output (I/O) element 230 via a bus 205. The CMOS image sensor 210 can communicate with the processor-based system 200 via the bus 205 or another communication link. The processor-based system 200 may also include a random access memory (RAM) 240, at least one of a floppy disc drive 250 and/or a compact disc-read only memory (CD-ROM) drive 250, and a port 260 which can communicate with CPU 220 via the bus 205. The port 260 may be coupled to a video card, a sound card, a memory card or a universal serial bus (USB) device, or may communicate with another system. The CMOS image sensor 210 may be integrated with a CPU, a digital signal processor (DSP) or a microprocessor. The CMOS image sensor 210 may also be integrated with a memory. The CMOS image sensor 210 and the processor-based system 200 may be integrated into separate chips.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. An image sensor comprising:
a plurality of photoelectric conversion elements arranged in a matrix;
a plurality of floating diffusion regions shared by respective corresponding pairs of adjacent ones of the plurality of photoelectric conversion elements;
a plurality of charge-transmission lines which extend in a row direction of the matrix and respectively correspond to a plurality of pairs of adjacent ones of rows of photoelectric conversion elements; and
a plurality of vertical signal lines extending in a column direction of the matrix and corresponding to respective corresponding columns of ones of the plurality of photoelectric conversion elements, further comprising a plurality of row selection lines extending in the row direction and respectively corresponding to the plurality of pairs of adjacent rows of photoelectric conversion elements, wherein:
the matrix comprises a 2m×n matrix;
a number of photoelectric conversion elements comprises 2m×n;
a number of floating diffusion regions comprises m×n;
a number of charge-transmission lines comprises (m+1);
a number of row selection lines comprises m; and
a number of vertical lines comprises n.

2. An image sensor comprising:
a plurality of photoelectric conversion elements arranged in a matrix;
a plurality of floating diffusion regions shared by respective corresponding pairs of vertically adjacent photoelectric conversion elements;
a plurality of charge-transmission transistors, configured to transmit charge accumulated in each of the photoelectric conversion elements to the floating diffusion regions, respectively corresponding to the photoelectric conversion elements, each of the transmission transistors being connected between a corresponding photoelectric conversion element and a corresponding floating diffusion region; and
a plurality of charge-transmission lines which control the charge accumulated in each of the respective corresponding pairs of vertically adjacent photoelectric conversion elements to be simultaneously transmitted to different floating diffusion regions in response to a charge-transmission signal, the charge-transmission lines being commonly connected to gates of respective corresponding pairs of adjacent rows of charge-transmission transistors, and each of the respective corresponding pairs of adjacent rows of charge-transmission transistors being connected to different rows of floating diffusion regions, further comprising:
a plurality of vertical signal lines extending in a column direction;
a plurality of amplification transistors configured to amplify an electric potential provided by respective ones of the plurality of floating diffusion regions; and
a plurality of selection transistors which, if an electric potential of a row of floating diffusion regions selected in response to a row-selection signal is amplified by a corresponding row of amplification transistors, output the amplified electrical potential to the vertical signal lines, further comprising:

a plurality of power supply voltage lines configured to provide a power supply voltage; and a plurality of row selection lines configured to provide the row-selection signal, wherein gates of the amplification transistors are respectively connected to ones of the plurality of floating diffusion regions, sources of the amplification transistors are respectively connected to drains of the selection transistors, drains of the amplification transistors are respectively connected to the vertical signal lines, gates of the selection transistors are respectively connected to the row selection lines, sources of the selection transistors are respectively connected to the drains of the amplification transistors, and the drains of the selection transistors are respectively connected to the power supply voltage lines, wherein the charge transmitted to the different floating diffusion regions in response to the charge-transmission signal is selectively output through the vertical signal lines in response to the row-selection signal, the matrix comprises a 2m×n matrix;

a number of photoelectric conversion elements comprises 2m×n;

a number of floating diffusion regions comprises m×n;

the number of charge-transmission transistors comprises 2m×n;

a number of amplification transistors comprises m×n;

a number of selection transistors comprises m×n;

a number of charge-transmission lines comprises (m+1);

a number of row selection lines comprises m; and a number of vertical lines comprises n.

3. The image sensor of claim 2, wherein the drains of a plurality of columns of amplification transistors are connected to the respective vertical signal lines.

4. The image sensor of claim 2, further comprising:

a plurality of reset lines extending in a row direction and configured to provide a reset signal; and a plurality of reset transistors which reset the floating diffusion regions in response to the reset signal, the reset transistors comprising gates respectively connected to ones of the plurality of reset lines, sources respectively connected to ones of the plurality of floating diffusion regions, and drains respectively connected to ones of the plurality power supply voltage lines.

5. The image sensor of claim 4, further comprising a plurality of correlated double samplers respectively connected to ones of the plurality of vertical signal lines.

6. The image sensor of claim 5, wherein each of the correlated double samplers comprises:

a first correlated double sampler configured to sample a signal level of a photoelectric conversion element connected to one of a pair of adjacent charge-transmission transistors whose gates are commonly connected to a predetermined charge-transmission line; and a second correlated double sampler configured to sample a signal level of a photoelectric conversion element connected to the other of the pair of adjacent charge-transmission transistors whose gates are commonly connected to the predetermined charge-transmission line, the first correlated double sampler and the second correlated double sampler configured to operate independent from each other through switching.

7. The image sensor of claim 5, wherein each of the correlated double samplers comprises:

a first charge storage capacitor configured to store a signal level of a photoelectric conversion element connected to one of a pair of adjacent charge-transmission transistors whose gates are commonly connected to a predetermined charge-transmission line; and a second charge storage capacitor configured to store a signal level of a photoelectric conversion element connected to the other of the pair of immediately adjacent charge-transmission transistors whose gates are commonly connected to the predetermined charge-transmission line, the first charge storage capacitor and the second charge storage capacitor being connected in parallel to each other and configured to operate independent from each other through switching.

* * * * *